United States Patent
Hsu et al.

(10) Patent No.: US 12,363,830 B2
(45) Date of Patent: Jul. 15, 2025

(54) ELECTRONIC DEVICE AND MANUFACTURING METHOD THEREOF

(71) Applicant: CARUX TECHNOLOGY PTE. LTD., Singapore (SG)

(72) Inventors: Hsin-Fa Hsu, Tainan (TW); Yu-Ling Hung, Tainan (TW); Hsien-Yao Hsiao, Tainan (TW); Tsu-Hsien Ku, Tainan (TW)

(73) Assignee: CARUX TECHNOLOGY PTE. LTD., Singapore (SG)

( * ) Notice: Subject to any disclaimer, the term of this patent is extended or adjusted under 35 U.S.C. 154(b) by 213 days.

(21) Appl. No.: 18/355,527

(22) Filed: Jul. 20, 2023

(65) Prior Publication Data
US 2024/0074062 A1    Feb. 29, 2024

(30) Foreign Application Priority Data
Aug. 26, 2022    (CN) .......................... 202211030986.8

(51) Int. Cl.
| H05K 3/00 | (2006.01) |
| H05K 1/18 | (2006.01) |
| H05K 3/28 | (2006.01) |
| H05K 3/30 | (2006.01) |

(52) U.S. Cl.
CPC .............. H05K 1/181 (2013.01); H05K 3/28 (2013.01); H05K 3/301 (2013.01); H05K 2201/09863 (2013.01)

(58) Field of Classification Search
CPC ............................. H05K 3/0014; H05K 1/181
See application file for complete search history.

(56) References Cited

U.S. PATENT DOCUMENTS

| 5,307,236 A | * | 4/1994 | Rio ..................... H01L 23/4006 361/720 |
| 5,808,878 A | * | 9/1998 | Saito ...................... H01L 25/18 257/659 |
| 10,677,963 B2 | | 6/2020 | Takai et al. |
| 10,949,637 B2 | | 3/2021 | Kang et al. |
| 10,964,660 B1 | * | 3/2021 | Alfandari ................ H01L 24/73 |
| 2016/0224822 A1 | | 8/2016 | Hasegawa et al. |

FOREIGN PATENT DOCUMENTS

| CN | 105844208 A | 8/2016 |
| TW | 201728373 A | 8/2017 |
| TW | M604917 U | 12/2020 |

* cited by examiner

*Primary Examiner* — Sherman Ng
(74) *Attorney, Agent, or Firm* — McClure, Qualey & Rodack, LLP

(57) ABSTRACT

An electronic device is provided, including an electronic element, and a protective substrate. The protective substrate includes a concave portion, and a flat portion. The concave portion has a concave surface and a convex surface that is opposite to the concave surface. The flat portion is connected to the concave portion. The electronic element overlaps the concave portion and is arranged under the convex surface.

16 Claims, 8 Drawing Sheets

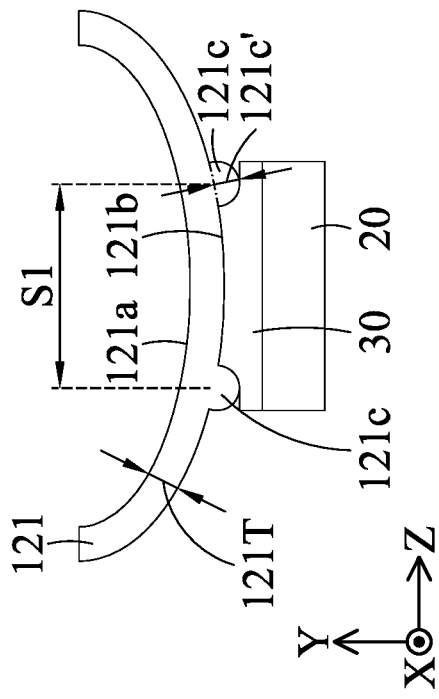
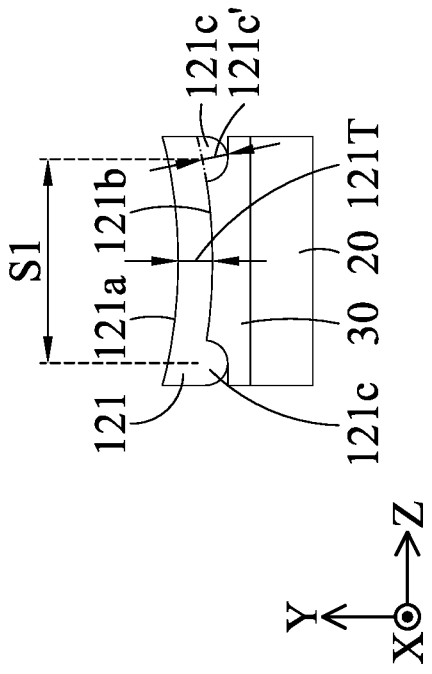
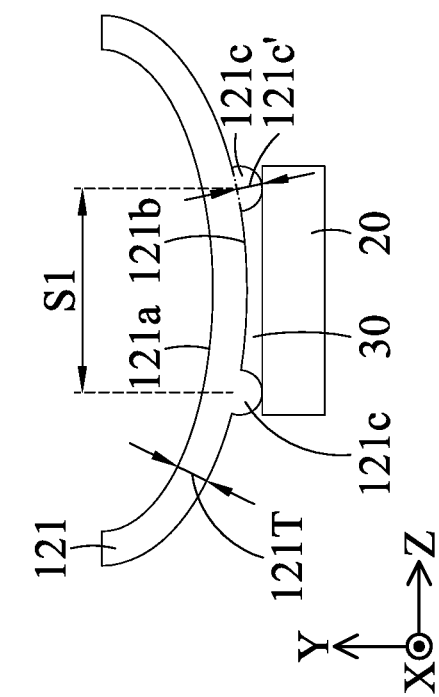
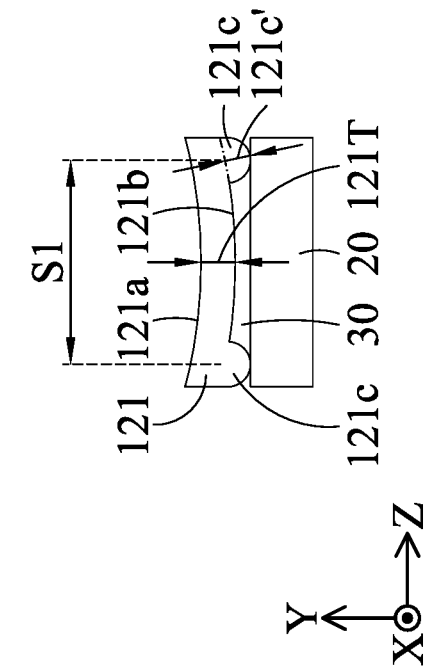

ELECTRONIC DEVICE AND MANUFACTURING METHOD THEREOF

CROSS REFERENCE TO RELATED APPLICATIONS

This application claims priority of China Patent Application No. 202211030986.8, filed on Aug. 26, 2022, the entirety of which is incorporated by reference herein.

BACKGROUND OF THE INVENTION

Field of the Invention

The present application relates to an electronic device and a manufacturing method thereof, in particular to an electronic device having a protective substrate with a concave portion and a manufacturing method thereof.

Description of the Related Art

With the development of technology, the protective substrate of the electronic device may have a bent portion. The existing protective substrate with a bent portion is composed of non-integrated glass and plastic, and glue may be optionally provided between the glass and plastic to connect the glass and plastic. However, outside moisture may pass through the glue and enter into the interior of the electronic device from the gap between the glass and the plastic, thereby affecting the quality of the electronic device.

In addition, foreign matter (such as dust and other particles) are also easy to enter the gap between the glass and the plastic, and the quality of the electronic device is affected.

Therefore, there is a need for an electronic device and manufacturing method thereof to solve the aforementioned problems.

BRIEF SUMMARY OF THE INVENTION

An electronic device is provided, including an electronic element, and a protective substrate. The protective substrate includes a concave portion, and a flat portion. The concave portion has a concave surface and a convex surface that is opposite to the concave surface. The flat portion is connected to the concave portion. The electronic element overlaps the concave portion and is arranged under the convex surface.

A method of manufacturing an electronic device is provided, including: forming a protective substrate, wherein the protective substrate includes: a concave portion having a concave surface and a convex surface that is opposite to the concave surface; and a flat portion, connected to the concave portion. The method further includes: overlapping the electronic element with the concave portion and disposing the electronic element under the convex surface. The protective substrate is formed by thermoforming.

BRIEF DESCRIPTION OF THE DRAWINGS

The present application may be more fully understood by reading the ensuing detailed description and examples with reference to the accompanying drawings, in which:

FIG. 4A shows a partially enlarged cross-sectional view of the protective substrate according to some embodiments of the present disclosure;

FIG. 4B shows a partially enlarged cross-sectional view of the protective substrate according to some embodiments of the present disclosure;

FIG. 4C shows a partially enlarged cross-sectional view of the protective substrate according to some embodiments of the present disclosure;

FIG. 4D shows a partially enlarged cross-sectional view of the protective substrate according to some embodiments of the present disclosure;

DETAILED DESCRIPTION OF THE APPLICATION

Figure 1:
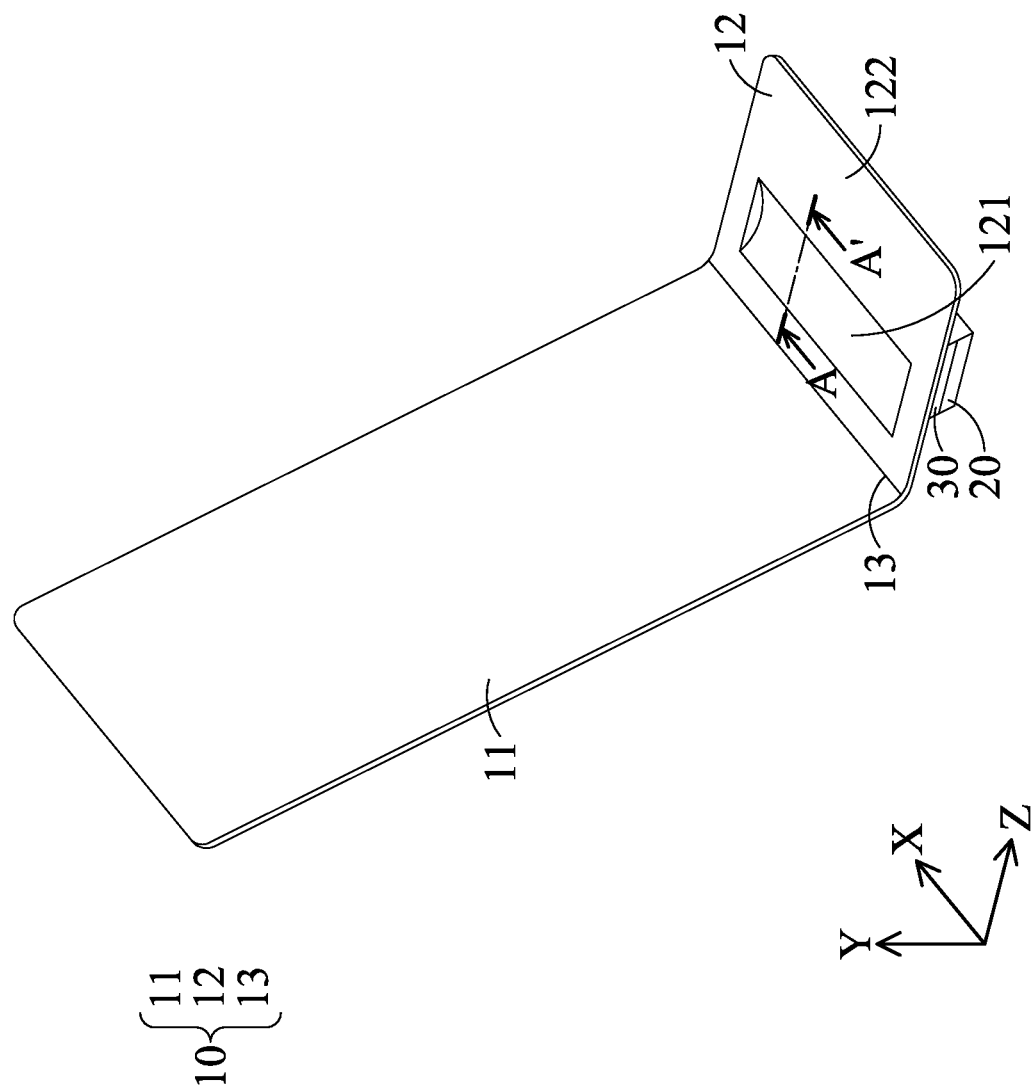
FIG. 1 shows a schematic view of some elements of an electronic device according to some embodiments of the present disclosure.

The present disclosure may be more clearly understood by referring to the following description and the appended drawings. It should be noted that, for the sake of the simplicity of the drawings and comprehensibility for readers, only a portion of the light-emitting unit is illustrated in multiple figures in the present disclosure, and the specific components in the figures are not drawn to scale. In addition, the number and size of each component in the drawings merely serve as an example, and are not intended to limit the scope of the present disclosure. Furthermore, similar and/or corresponding numerals may be used in different embodiments for describing some embodiments simply and clearly, but they do not represent any relationship between different embodiments and/or structures discussed below.

Certain terms may be used throughout the present disclosure and the appended claims to refer to particular elements. Those skilled in the art will understand that electronic device manufacturers may refer to the same components by different names. The present specification is not intended to distinguish between components that have the same function but different names. In the following specification and claims, the words "including", "comprising", "having" and the like are open-ended words, so they should be interpreted as meaning "including but not limited to . . . " Therefore, when the terms "including", "comprising", and/or "having" are used in the description of the disclosure, the presence of corresponding features, regions, steps, operations and/or components is specified without excluding the presence of one or more other features, regions, steps, operations and/or components.

In addition, in this specification, relative expressions may be used. For example, "lower", "bottom", "higher" or "top" are used to describe the position of one element relative to another. It should be noted that if a device is flipped upside down, an element that is "lower" will become an element that is "higher".

When a corresponding component (i.e. a film layer or region) is referred to as "on another component", it may be directly on another component, or there may be other components in between. On the other hand, when a component is referred "directly on another component", there is no component between the former two. In addition, when a component is referred "on another component", the two components have an up-down relationship in the top view, and this component can be above or below the other component, and this up-down relationship depends on the orientation of the device.

The terms "about," "equal to," "equivalent," "the same as," "essentially," or "substantially" are generally interpreted as within 20% of a given value or range, or as interpreted as within 10%, 5%, 3%, 2%, 1%, or 0.5% of a given value or range.

In the present disclosure, when mentioning that the A element overlaps the B element, it means to include at least partial overlap.

It should be understood that, although the terms "first", "second" etc. may be used herein to describe various elements, layers and/or portions, and these elements, layers, and/or portions should not be limited by these terms. These terms are only used to distinguish one element, layer, or portion. Thus, a first element, layer or portion discussed below could be termed a second element, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims can be interpreted as any element that meets the description in the specification.

In the present disclosure, the thickness, length, and width can be measured by using an optical microscope, and the thickness can be measured by the cross-sectional image in the electron microscope, but it is not limited thereto. In addition, a certain error may be present in a comparison with any two values or directions. If the first value is equal to the second value, the deviation between the first value and the second value may be within about 10%. If the first direction is perpendicular to the second direction, the angle between the first direction and the second direction may be between 80 degrees (≥80 degrees) and 100 degrees (≤100 degrees). If the first direction is parallel to the second direction, the angle between the first direction and the second direction may be between 0 degree (≥0 degree) and 10 degrees (≤10 degrees).

It should be noted that the technical solutions provided by different embodiments below may be interchangeable, combined or mixed to form another embodiment without departing from the spirit of the present disclosure.

Unless defined otherwise, all terms (including technical and scientific terms) used herein have the same meaning as commonly understood by one having ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

The electronic device may include a display device, a backlight device, an antenna device, a sensing device or a splicing device, but it is not limited thereto. The electronic device may be a bendable or flexible electronic device. The display device may be a non-self-luminous display device or a self-luminous display device. The antenna device may be a liquid crystal type antenna device or a non-liquid crystal type antenna device, and the sensing device may be a sensing device for sensing capacitance, light, thermal energy or ultrasonic waves, but it is not limited thereto. The electronic devices may include passive devices and active devices, such as capacitors, resistors, inductors, diodes, transistors, and the like. The diodes may include light emitting diodes or photodiodes. The light emitting diode may include, for example, an organic light emitting diode (OLED), a mini LED, a micro LED or a quantum dot LED, but it is not limited thereto. The splicing device may be, for example, a display splicing device or an antenna splicing device, but it is not limited thereto. It should be noted that, the electronic device may be any combination mentioned above, but it is not limited thereto. In the following, a display device is used as an electronic device or a splicing device to illustrate the content of the present disclosure, but the present disclosure is not limited thereto.

Please refer to FIG. 1, FIG. 1 shows a schematic view of some elements of an electronic device according to some embodiments of the present disclosure. The electronic device may be, but not limited to, a vehicle electronic device, a carrier electronic device, a tablet, a computer, a wearable electronic device, a mobile phone, and the like.

As shown in FIG. 1, the electronic device may include a protective substrate 10, an electronic element 20, and an attachment 30.

The protective substrate 10 may include a first area 11, a second area 12, and a connective area 13. In some embodiments (not shown), the panel (not shown) may overlap the first area 11 and the panel may be located at the position of the user in the first area 11. In some embodiments (not shown), the panel may include a display panel, a sensing panel, a touch panel, an antenna panel, a light emitting panel, a handwriting panel, other panels or any combination thereof. In some embodiments, the electronic element 20 may overlap the second area 12 and the electronic element 20 may be located at the position of the user in the second area 12. According to some embodiments, the electronic element 20 may include a sensor. For example, the electronic element 20 may include a fingerprint sensor, a touch sensor, a face recognition sensor or other sensors, but it is not limited thereto. According to some embodiments, the first region 11 and the second region 12 may be connected to each other by a connection region 13. According to some embodiments (not shown), a portion of the panel (not shown) may selectively overlap the second area 12. According to some embodiments of the present disclosure, the protective substrate 10 may be made of glass, but it is not limited thereto. For example, the protective substrate 10 may be made of any suitable material (for example, ceramics, or plastics).

Please continue to refer to FIG. 1, the protective substrate 10 may be integrally formed. In other words, the first area 11, the second area 12, and the connective area 13 are integrally formed. For example, the first area 11, the second area 12, and the connective area 13 of the protective substrate 10 may be integrally formed by thermal forming.

As shown in FIG. 1, according to some embodiments, the first region 11 may have a rectangular shape when viewed from the top, and corners may optionally have arc edges, but it is not limited thereto. According to some embodiments, when viewed from the top, the first region 11 may have a tapered or expanded rectangular shape, such as a trapezoidal shape or other shapes.

According to some embodiments, when viewed from the top, the second region 12 may have a rectangular shape, and corners may optionally have arc edges, but it is not limited thereto. According to some embodiments, when viewed from the top, the second region 12 may have a tapered or expanded rectangular shape, such as a trapezoidal shape or other shapes.

According to some embodiments, the surface of the connective area 13 may have a curved surface, but it is not limited thereto.

It should be noted that although FIG. 1 shows that the protective substrate 10 only includes one first region 11, one second region 12, and one connection region 13, it is not limited thereto. According to some embodiments, the protective substrate 10 may include one or more first regions 11, one or more second regions 12, or one or more connection regions 13.

According to some embodiments (not shown), the protective substrate 10 may include one first region 11, two second regions 12, and two connection regions 13, but it is not limited thereto. The two second regions 12 may be located on different sides (for example, the opposite sides) of the first region 11, and the two connective regions 13 may be connected between the first region 11 and one of the second regions 12.

Since the protective substrate 10 in the embodiment of the present disclosure is integrally formed, there is no need to connect the first region 11 and the second region 12 of the protective substrate 10 through additional attachments (for example, glue, etc.). In this way, the external moisture is prevented from passing through the protective substrate 10, and the quality of the electronic device is improved.

The first region 11 and the second region 12 of the protective substrate 10 of the present disclosure have no gaps, thus the foreign matter (such as dust and other particles) is prevented from entering into the first region 11 and the second region 12, and the quality of electronic device is improved.

Furthermore, the protective substrate 10 of the embodiment of the present disclosure may improve the sensitivity of the second region 12. For example, due to the higher sensitivity, the second area 12 may distinguish a smaller finger separation distance.

As shown in FIG. 1, according to some embodiments, the first region 11 of the protective substrate 10 may have a flat plate shape, but it is not limited thereto. According to some embodiments, the second region 12 of the protective substrate 10 may include a concave portion 121 and a flat portion 122.

According to some embodiments, the flat portion 122 may be connected to the concave portion 121. For example, the flat portion 122 may be disposed close to the concave portion 121, or the flat portion 122 may be disposed around the concave portion 121. As shown in FIG. 1, the flat portion 122 may have a flat surface.

Figure 2:
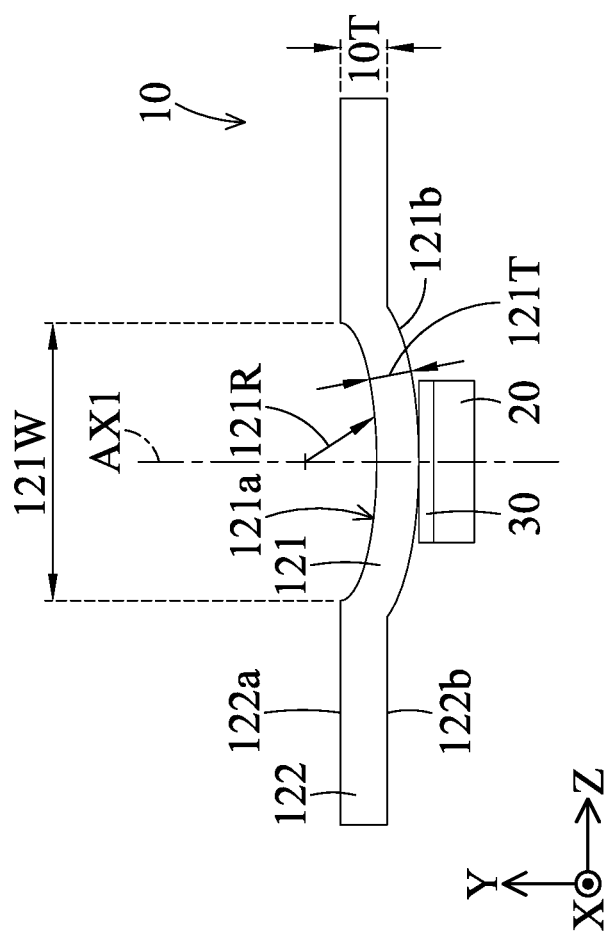
FIG. 2 shows a cross-sectional view of the protective substrate, the second region, and the connective region along the line A-A' of FIG. 1, according to some embodiments of the present disclosure.

Please refer to FIG. 2. FIG. 2 shows a cross-sectional view of the protective substrate 10, the second region 12, and the connective region 13 along the line A-A' of FIG. 1, according to some embodiments of the present disclosure. As shown in FIG. 2, the concave portion 121 may be a recess, for example, the recess is recessed toward the direction of the electronic element 20.

As shown in FIG. 2, the concave portion 121 may include a concave surface 121a and a convex surface 121b that is opposite to the concave surface 121a. The concave surface 121a faces upwards (i.e., the viewing surface of the user).

According to some embodiments, the convex surface 121b and the concave surface 121a may overlap each other when viewed along a normal direction AX1 (or Y direction) that is perpendicular to the flat portion 122.

According to some embodiments, the shape of the convex surface 121b may be substantially the same as or similar to the shape of the concave surface 121a. According to some embodiments, the shape of the convex surface 121b may be different from the shape of the concave surface 121a.

Please continue to refer to FIG. 2, the flat portion 122 may include an upper surface 122a and a lower surface 122b that is opposite to the upper surface 122a. The upper surface 122a faces upwards (i.e., the viewing surface of the user), the upper surface 122a and the lower surface 122b may overlap each other when viewed along the normal direction AX1 that is perpendicular to the flat portion 122.

As shown in FIG. 2, the electronic element 20 may overlap the concave portion 121, and the electronic element 20 may be disposed under the concave portion 121. Therefore, compared to the concave surface 121a of the concave portion 121, the convex surface 121b of the concave portion 121 is closer to the electronic element 20.

In this way, the design of the concave portion 121 may make it easier for the user to judge the position of the electronic element 20.

Please continue to refer to FIG. 2, the flat portion 122 of the protective substrate 10 may have a thickness 10T, and the concave portion 121 may have a thickness 121T. According to some embodiments, the thickness 121T of the concave portion 121 may be the same as the thickness 10T of the flat portion 122, but it is not limited thereto. In some other embodiments, the thickness 121T of the concave portion 121 may be different from the thickness 10T of the flat portion 122.

According to some embodiments, the overall thickness of the protective substrate 10 may be approximately the same, for example, the thickness 10T is approximately the same as the thickness 121T; in other words, the overall thickness of the protective substrate 10 may be unchanged, but not limited thereto. According to some embodiments, the overall thickness of the protective substrate 10 may be inconsistent, for example, the thickness 10T and the thickness 121T are different; in other words, the overall thickness of the protective substrate 10 may be variable. According to some embodiments, for example, the thickness (not shown) of the first region 11 and/or the thickness (not shown) of the connective region 13 are the same as or different from the thickness 10T.

According to some embodiments, the thickness 10T of the protective substrate 10 may range from about 0.7 millimeters (mm) to about 2.0 mm (0.7 mm≤thickness 10T≤2.0 mm), but it is not limited thereto. According to some embodiments, the thickness 10T may be between about 0.9 millimeters (mm) to about 1.8 mm (0.9 mm≤thickness 10T≤1.8 mm), but it is not limited thereto. According to some embodiments, the thickness 10T may be between about 1 millimeter (mm) and about 1.7 mm (1 mm≤thickness 10T≤1.7 mm), but it is not limited thereto. For example, according to some embodiments of the present disclosure, the thickness 10T of the protective substrate 10 may be about 1.3 mm, but it is not limited thereto.

According to some embodiments, the thickness 121T of the concave portion 121 may be uniform; in other words, the thickness 121T of the concave portion 121 may have no variation, but it is not limited thereto. According to some embodiments, the thickness 121T of the concave portion 121 may be non-uniform; in other words, the thickness 121T of the concave portion 121 may vary.

According to some embodiments, the thickness 121T of the concave portion 121 may be between about 0.7 mm and about 2.0 mm (0.7 mm≤thickness 121T≤2.0 mm). According to some embodiments, the thickness 121T may be between about 0.9 millimeters (mm) to about 1.8 mm (0.9 mm≤thickness 121T≤1.8 mm), but it is not limited thereto. According to some embodiments, the thickness 121T may be between about 1 millimeter (mm) and about 1.7 mm (1 mm≤thickness 121T≤1.7 mm), but it is not limited thereto. In some embodiments of the present disclosure, the thickness 121T of the concave portion 121 may be about 1.3 mm, but it is not limited thereto.

As shown in FIG. 2, in the Z direction (for example, the direction in which the sides of the first region 11, the connective region 13 and the second region 12 may be viewed at the same time), the concave portion 121 may have a width 121W. According to some embodiments, the width 121W of the concave portion 121 may be greater than 0 (width 121W>0), but it is not limited thereto. For example, according to some embodiments, the width 121W of the concave portion 121 may be greater than 5 mm (width 121W>5 mm). According to some embodiments, the width 121W of the concave portion 121 may be between about 15 mm and about 20 mm (15 mm≤width 121W≤20 mm), but it is not limited thereto. According to some embodiments, the width 121W of the concave portion 121 may be between about 16 mm and about 19 mm (16 mm≤width 121W≤19 mm).

Please refer to FIG. 2, the concave portion 121 may have a curvature 121R. According to some embodiments, the curvature 121R of the concave portion 121 may be between about 10 mm and about 50 mm (10 mm≤curvature 121R≤50 mm), but it is not limited thereto. According to some embodiments, the curvature 121R of the concave portion 121 may be between about 15 mm and about 45 mm (15 mm≤curvature 121R≤45 mm). According to some embodiments, the curvature 121R of the concave portion 121 may be between about 18 mm and about 43 mm (18 mm≤curvature 121R≤43 mm). According to some embodiments, the curvature 121R of the concave portion 121 may be about 17 mm, but it is not limited thereto.

Figure 3:
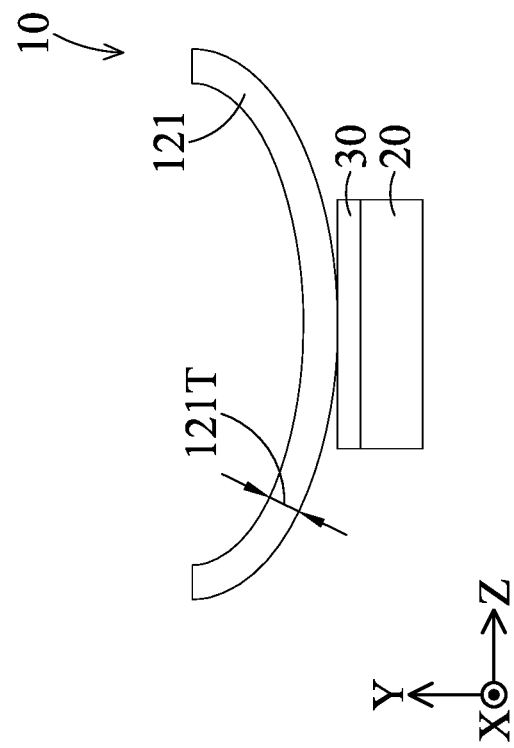
FIG. 3 shows a partially enlarged cross-sectional view of the protective substrate of FIG. 2, according to some embodiments of the present disclosure.

Please refer to FIG. 3, FIG. 3 shows a partially enlarged cross-sectional view of the protective substrate 10 of FIG. 2, according to some embodiments of the present disclosure. As shown in FIG. 3, the attachment 30 may be disposed between the protective substrate 10 and the electronic element 20, and the attachment 30 may be in contact with the protective substrate 10 and the electronic element 20, so as to connect the electronic element 20 to the protective substrate 10.

For example, as shown in FIG. 3, the attachment 30 may be disposed between the convex surface 121b of the concave portion 121 of the protective substrate 10 and the electronic element 20, and the attachment 30 may be in contact with the convex surface 121b and the electronic element 20, so as to connect the electronic element 20 to the convex surface 121b.

According to some embodiments, the attachment 30 may include glue. For example, the attachment 30 may include solid glue (for example, Optically Clear Adhesivs (OCA)), liquid glue or other suitable glue. According to some embodiments, the attachment 30 may include moisture-curing glue, light-curing glue, or other suitable glue.

Please refer to FIG. 3, the thickness 121T of the concave portion 121 may be uniform; in other words, the thickness 121T of the concave portion 121 may unchanged. In the embodiment of FIG. 3, the thickness 121T of the concave portion 121 may be between about 0.7 mm and about 2.0 mm (0.7 mm≤thickness 121T≤2.0 mm), but it is not limited thereto. According to some embodiments, the thickness 121T of the concave portion 121 may be between about 0.9 mm and about 1.8 mm (0.9 mm≤thickness 121T≤1.8 mm). According to some embodiments, the thickness 121T of the concave portion 121 may be between about 1 mm and about 1.7 mm (1 mm≤thickness 121T≤1.7 mm). According to some embodiments, the thickness 121T of the concave portion 121 may be about 1.3 mm, but it is not limited thereto.

Please refer to FIG. 4A. FIG. 4A shows a partially enlarged cross-sectional view of the protective substrate 10 according to some embodiments of the present disclosure. As shown in FIG. 4A, according to some embodiments of the present disclosure, the concave portion 121 may further include at least one microstructure 121c.

In the embodiment shown in FIG. 4A, on a cross-section, the concave portion 121 may include two microstructures 121c, but other embodiments of the present disclosure are not limited thereto. In fact, on a cross-section, the concave portion 121 may include more than two microstructures 121c, for example, the concave portion 121 may include three, four, or more microstructures 121c.

According to some embodiments, the microstructure 121c may be formed on the convex surface 121b, and the microstructure 121c may extend away from the convex surface 121b, for example, from the convex surface 121b.

Please continue to refer to FIG. 4A, according to some embodiments, for example, at least one microstructure 121c is adjacent to the electronic element 20. Specifically, in the Y direction, the electronic element 20 may overlap the microstructure 121c, and the electronic element 20 may be disposed under the microstructure 121c.

As shown in FIG. 4A, according to some embodiments, the attachment 30 may be disposed between the convex surface 121b of the concave portion 121 and the electronic element 20, so as to connect the electronic element 20 to the convex surface 121b.

According to some embodiments, the attachment 30 may be disposed between adjacent microstructures 121c to hold the attachment 30 between the convex surface 121b and the electronic element 20. According to some embodiments, at least one microstructure may be in contact with the attachment 30. According to some embodiments, the attachment 30 may be in contact with the microstructure 121c and the electronic element 20.

In the embodiment of FIG. 4A, the microstructure 121c may be in contact with the electronic element 20. In this way, the attachment 30 may be disposed in the space formed by the convex surface 121b, the microstructure 121c, and the electronic element 20 to reduce the undesired flow of the attachment 30.

Please refer to FIG. 4A, according to some embodiments, the thickness 121T of the concave portion 121 may be between about 0.7 mm and about 2.0 mm (0.7 mm≤thickness 121T≤2.0 mm), but it is not limited thereto. According to some embodiments, the thickness 121T of the concave portion 121 may be between about 0.9 mm and about 1.8 mm (0.9 mm≤thickness 121T≤1.8 mm).

As shown in FIG. 4A, in the Y direction, the microstructure 121c may have a height 121c'. According to some embodiments, the height 121c' of the microstructure 121c may be greater than 0 (height 121c'>0). According to some embodiments, the height 121c' of the microstructure 121c may be between 0 and about 1 mm (0<height 121c'≤1 mm), but not limited to. According to some embodiments, the height 121c' of the microstructure 121c may be between 0.02 mm and 0.8 mm (0.02 mm<height 121c'≤0.8 mm), but it is not limited to.

According to some embodiments, under a cross-section, the height 121c' of the microstructure 121c may be the distance in the Y direction from the convex surface 121b to the point where the microstructure 121c is the farthest from the convex surface 121b. In other words, for example, the height 121c' is the maximum thickness of the microstructure 121c in the Y direction under a cross-section.

Please continue to refer to FIG. 4A, in the embodiment of FIG. 4A, there may be a distance S1 between the two microstructures 121c in the Z direction, and the distance S1 may be greater than 0 (distance S1>0). For example, according to some embodiments, the distance S1 may be greater than or equal to 5 millimeters (distance S1≥5), but it is not limited thereto. According to some embodiments, the distance S1 may be between 5 mm and 15 mm (5 mm≤distance S1≤15 mm), but it is not limited thereto.

Please refer to FIG. 4B. FIG. 4B shows a partially enlarged cross-sectional view of the protective substrate 10 according to some embodiments of the present disclosure. The configuration in FIG. 4B is similar to that in FIG. 4A. The main difference between FIG. 4B and FIG. 4A is that the microstructure 121c in FIG. 4B is not in contact with the electronic element 20.

In this way, the contacting area between the attachment portion 30 and the electronic element 20 may be increased, or the contacting area between the attachment portion 30 and the convex surface 121b may be increased, and the connection between the attachment portion 30 and the electronic element 20 may be enhanced.

In the embodiment of FIG. 4B, the thickness 121T of the concave portion 121, the height 121c' of the microstructures 121c and/or the distance S1 between the two microstructures 121c may be similar to the embodiment shown in FIG. 4A.

Please refer to FIG. 4C and FIG. 4D. FIG. 4C shows a partially enlarged cross-sectional view of the protective substrate 10 according to some embodiments of the present disclosure. FIG. 4D shows a partially enlarged cross-sectional view of the protective substrate 10 according to some embodiments of the present disclosure.

The configuration in FIG. 4C is similar to that in FIG. 4A. The main difference between FIG. 4C and FIG. 4A is that the two adjacent microstructures 121c in FIG. 4C may be disposed at two ends of the flat portion 122; that is, the two microstructures 121c may respectively connect to, for example, the flat portion 122. However, the two adjacent microstructures 121c in FIG. 4A are, for example, separated by a distance from both ends of the concave portion 121. That is, for example, the two microstructures 121c may not be connected to the flat portion 122. Similarly, the configuration of FIG. 4D is similar to the configuration of FIG. 4B. The difference between FIG. 4D and FIG. 4B is that the two adjacent microstructures 121c in FIG. 4D may be disposed at two ends of the flat portion 122. However, the two adjacent microstructures 121c in FIG. 4A are, for example, separated by a distance from both ends of the concave portion 121. Similarly, the microstructure 121c in FIG. 4C or FIG. 4D has a height 121c'. According to some embodiments, the height 121c' of the microstructure 121c may be greater than 0 (height 121c'>0). According to some embodiments, the height 121c' of the microstructure 121c may be between 0 and about 1 mm (0<height 121c'≤1 mm), but it is not limited to. According to some embodiments, height 121c' may be between 0.02 mm and 0.8 mm (0.02 mm<height 121c'≤0.8 mm), but it is not limited to.

In the Z direction, there may be a distance S1 between the microstructures 121c in FIG. 4C and FIG. 4D, and the distance S1 is greater than 0 (distance S1>0). For example, according to some embodiments of the present disclosure, the distance S1 between the two microstructures 121c in FIG. 4C and FIG. 4D may be greater than or equal to about 5 millimeters (distance S1≥5 mm), but it is not limited thereto. According to some embodiments, the distance S1 may be between 5 mm and 20 mm (5 mm≤distance S1≤20 mm), but it is not limited thereto.

According to some embodiments, the embodiment shown in FIG. 4C may be similar to the embodiment of FIG. 4A, and the microstructure 121c may be in contact with the electronic element 20. According to some embodiments, the embodiment shown in FIG. 4D may be similar to the embodiment shown in FIG. 4B, and the microstructure 121c may not be in contact with the electronic element 20.

Figure 5:
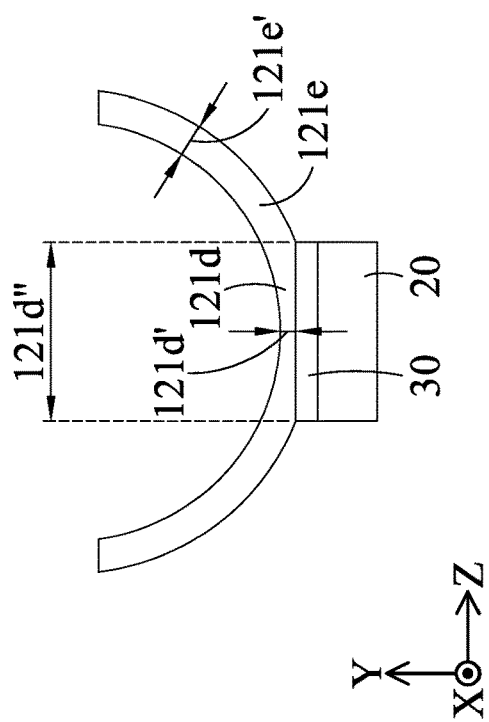
FIG. 5 shows a partially enlarged cross-sectional view of the protective substrate according to some embodiments of the present disclosure.

Please refer to FIG. 5, FIG. 5 shows a partially enlarged cross-sectional view of the protective substrate 10 according to some embodiments of the present disclosure. As shown in FIG. 5, according to some embodiments of the present disclosure, the concave portion 121 may further include a first portion 121d and a second portion 121e.

As shown in FIG. 5, the first portion 121d may overlap the electronic element 20 and/or the attachment 30. The attachment 30 is disposed between the first portion 121d and the electronic element 20 to connect or attach the electronic element 20 to the first portion 121d. The second portion 121e may not overlap the electronic element 20 and/or the attachment 30.

Please continue to refer to FIG. 5, in a cross-section, the first portion 121d may have different thicknesses in different parts. In other words, the thickness of the first portion 121d may vary. The second portion 121e may have substantially the same thickness in different area. In other words, the thickness of the second portion 121e may not vary. According to some embodiments, the thickness of the first portion 121d may be different from the thickness 10T of the flat portion 122 (as shown in FIG. 2). According to some embodiments, the minimum thickness 121d' of the first portion 121d may be different from the minimum thickness 121e' of the second portion 121e. According to some embodiments, the minimum thickness 121d' of the first portion 121d may be smaller than the thickness 10T of the flat portion 122 or the minimum thickness 121e' of the second portion (minimum thickness 121d'<thickness 10T; minimum thickness 121d'<minimum thickness 121e').

According to some embodiments, the minimum thickness 121d' of the first portion 121d may be greater than 0 (minimum thickness 121d'>0). According to some embodiments, the minimum thickness 121d' of the first portion 121d may be between about 0.5 mm and about 1 mm (0.5 mm≤minimum thickness 121d'≤1 mm), but it is not limited to. According to some embodiments, the minimum thickness 121d' of the first portion 121d may be between about 0.6 mm and about 0.9 mm (0.6 mm≤minimum thickness 121d'≤0.9 mm). According to some embodiments, the minimum thickness 121d' of the first portion 121d may be between about 0.65 mm and about 0.85 mm (0.65 mm≤minimum thickness 121d'≤0.85 mm).

According to some embodiments, the minimum thickness 121e' of the second portion 121e may be the same as the thickness 10T. According to some embodiments, the minimum thickness 121e' of the second portion 121e may be between about 0.7 mm and about 2.0 mm (0.7 mm≤minimum thickness 121e'≤2.0 mm). According to some embodiments, the minimum thickness 121e' of the second portion 121e may be between about 0.9 mm and about 1.8 mm (0.9 mm≤minimum thickness 121e'≤1.8 mm). For example, the minimum thickness 121e' of the second portion 121e may be about 1.3 millimeters.

As shown in FIG. 5, according to some embodiments, the side surface of the first portion 121d that is adjacent to the electronic element 20 may have a relatively flat surface, which may increase the contacting area between the attachment 30 and the protective substrate 10 and enhance adhesion.

Referring to FIG. 5, in the Z direction, the first portion 121d may have a width 121d". According to some embodiments, the width 121d" of the first portion 121d may be greater than or equal to 5 mm and less than or equal to 20 mm (5 mm≤width 121d"≤20 mm), but it is not limited to.

Figure 6:
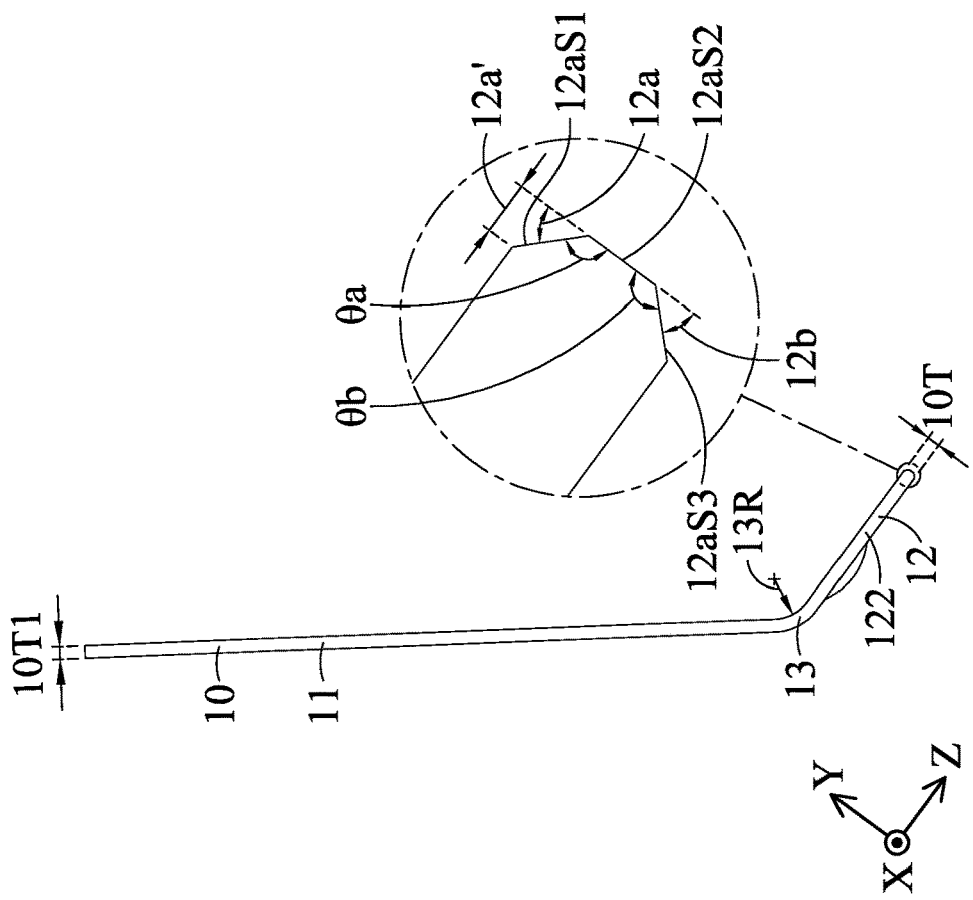
FIG. 6 shows a side view of the protective substrate and a partially enlarged side view of the protective substrate according to some embodiments of the present disclosure.

Please refer to FIG. 6. FIG. 6 shows a side view of the protective substrate 10 and a partially enlarged side view of the protective substrate 10 according to some embodiments of the present disclosure.

As shown in FIG. 6, according to some embodiments, the thickness 10T1 of the first region 11 of the protective substrate 10 and the thickness 10T of the flat portion of the second region 12 may be substantially the same.

The connection region 13 of the protective substrate 10 may have a curvature 13R. According to some embodiments, the curvature 13R of the connective region 13 may be between 5 mm and 100 mm (5 mm≤curvature 13R≤100 mm), but it is not limited thereto. According to some embodiments, the curvature 13R of the connective region 13 may be between 5 mm and 50 mm (5 mm≤curvature 13R≤50 mm). According to some embodiments, the curvature 13R of the connective region 13 may be between 5 mm and 30 mm (5 mm≤curvature 13R≤30 mm). According to some embodiments, the curvature 13R of the connective region 13 may be between 5 mm and 10 mm (5 mm≤curvature 13R≤10 mm).

As shown in FIG. 6, the end of the second region 12 of the protective substrate 10 (the end away from the first region 11) may have a chamfer 12a and a chamfer 12b. According to some embodiments, the chamfer 12a may be formed, for example, by connecting the surface 12aS1 and the surface 12aS2, and the chamfer 12b may be formed, for example, by connecting the surface 12aS3 and the surface 12aS2. According to some embodiments, the angle θa between the surface 12aS1 and the surface 12aS2 and/or the angle θb between the surface 12aS3 and the surface 12aS2 is, for example, about 125 degrees to 145 degrees, (125 degrees≤angle θa, angle θb≤145 degrees), but it is not limited to this. According to some embodiments, the angle θa between the surface 12aS1 and the surface 12aS2 and/or the angle θb between the surface 12aS3 and the surface 12aS2 is, for example, about 130 degrees to 140 degrees, (130 degrees≤angle θa, angle θb≤140 degrees), but it is not limited to this. According to some embodiments, in the Z direction, the distance 12a' between the end point of the surface 12aS1 away from the surface 12aS2 and the surface 12aS2 may be between 0.05 mm and 0.2 mm (0.05 mm≤distance 12a'≤0.2 mm), but it is not limited to. According to some embodiments, the distance 12a' may be between 0.08 mm and 0.17 mm (0.08 mm≤distance 12a'≤0.17 mm).

Figure 7:
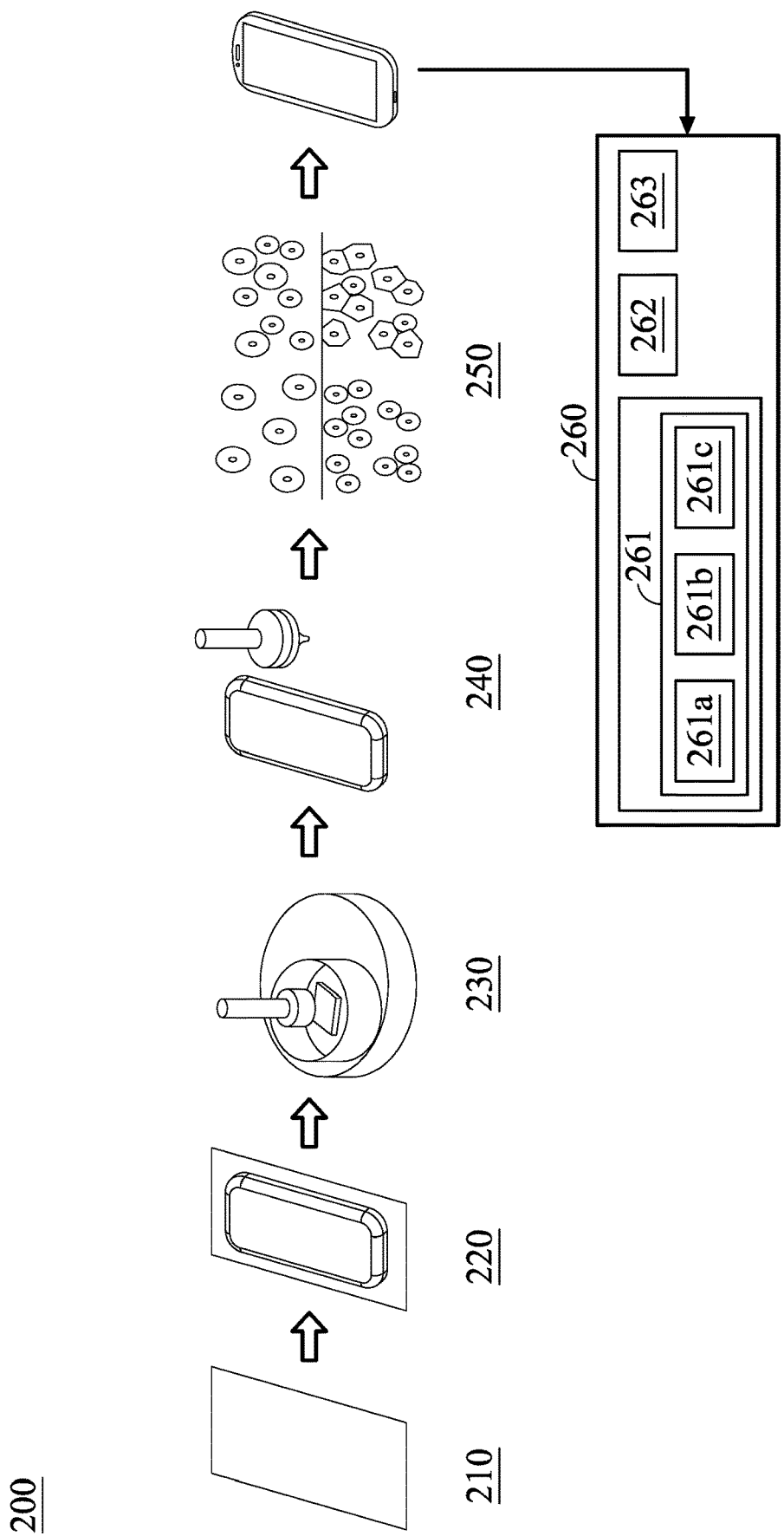
FIG. 7 shows a flowchart of a method for manufacturing an electronic device according to some embodiments of the present disclosure.

Please refer to FIG. 7, FIG. 7 shows a flowchart of a method 200 for manufacturing an electronic device according to some embodiments of the present disclosure.

In step 210, a substrate is provided. According to some embodiments, the substrate may be integrally formed. According to some embodiments, the substrate may include glass, but it is not limited thereto. In step 220, a protective substrate is formed, and the protective substrate may be formed by thermal forming. For example, in step 220, the substrate SS may be placed into the mold 300 and pressed against the mold 300 to form a protective substrate by thermal forming. According to some embodiments, step 220 may be operated at high temperature (for example, but it is not limited to 900° C.). In step 220, the protective substrate formed may be similar to the aforementioned protective substrate 10, That is, the protective substrate may include a concave portion 121 and a flat portion 122.

The concave portion 121 may have a concave surface 121a and a convex surface 121b that is opposite to the concave surface 121a. According to some embodiments, step 220 may include step 221, step 222, or step 223.

Figure 8:
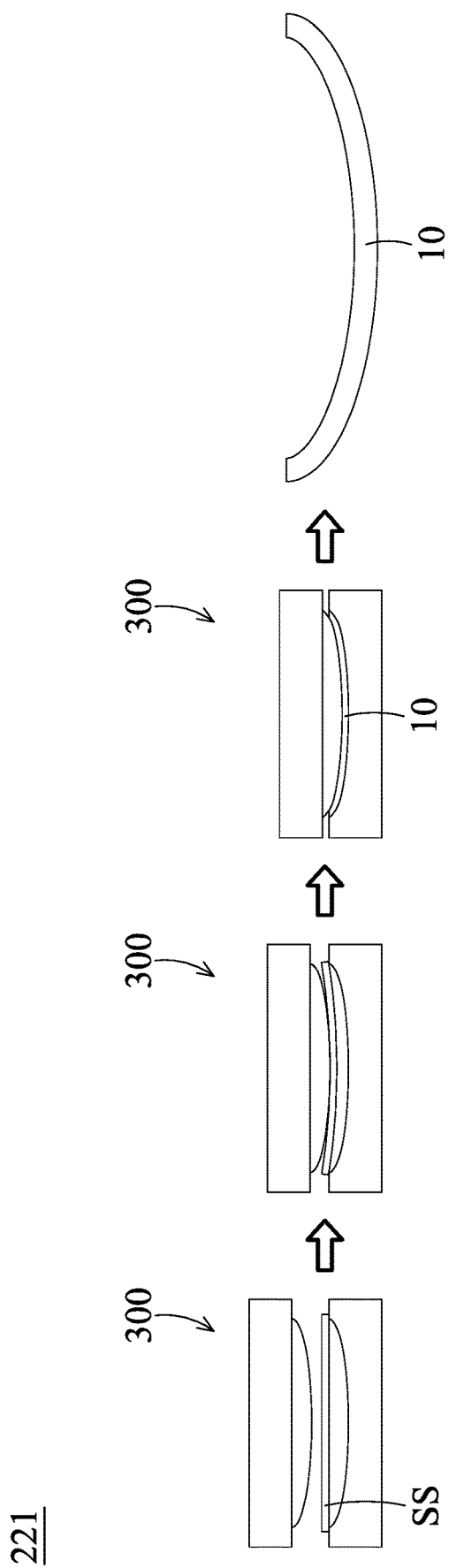
FIG. 8 shows a schematic view of manufacturing a protective substrate using a mold according to some embodiments of the present disclosure.

Please refer to FIG. 8, FIG. 8 shows a schematic view of manufacturing a protective substrate using a mold 300 according to some embodiments of the present disclosure. It should be noted that FIG. 8 only illustrates a part of the mold 300 and a method for manufacturing the protective substrate 10 in a partial region (such as the concave portion 121 of the aforementioned second region 12). As shown in FIG. 8, in step 221, for example, male and female molds 300 having approximately the same curved surface (That is, similar radii of curvature) are used, and the substrate SS disposed between the male and female molds 300 is, for example, heat pressed and molded to form the protective substrate 10 with a substantially uniform thickness, or a protective substrate with a substantially uniform curvature radii of the upper surface and the lower surface, but it is not limited thereto.

According to some embodiments, the protective substrate formed in step 221 may be similar to the protective substrate described in the embodiment in FIG. 2 or FIG. 3.

Figure 9:
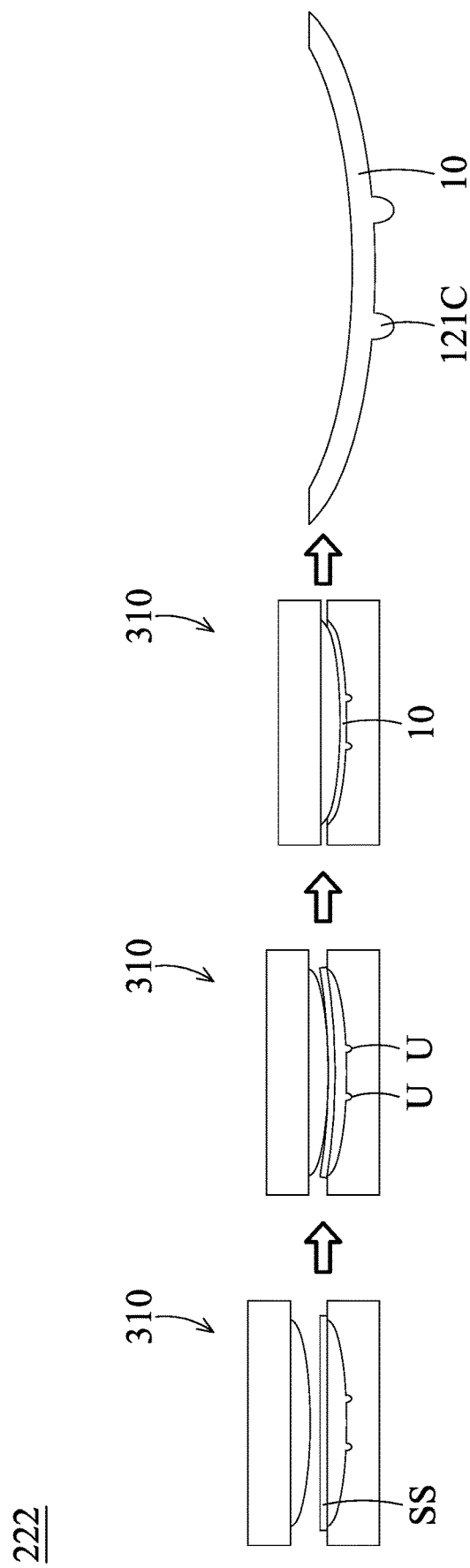
FIG. 9 shows a schematic view of manufacturing a protective substrate using another mold according to some embodiments of the present disclosure.

Please refer to FIG. 9, FIG. 9 shows a schematic view of manufacturing a protective substrate using another mold 310 according to some embodiments of the present disclosure. It should be noted that FIG. 9 only illustrates a partial mold 310 and a manufacturing method of the protective substrate 10 in a partial region (such as the concave portion 121 of the aforementioned second region 12). In step 222, for example, the male and female molds 300 have approximately the same curved surface (that is, similar radii of curvature) are used, but the female mold 300 may be, for example, a concave structure U, and the substrate SS disposed between the male and female molds 310, for example, is heat-pressed and molded to form the protective substrate 10 with at least one microstructure 121c (as shown in FIG. 4A to FIG. 4D) formed in the concave portion.

Figure 10:
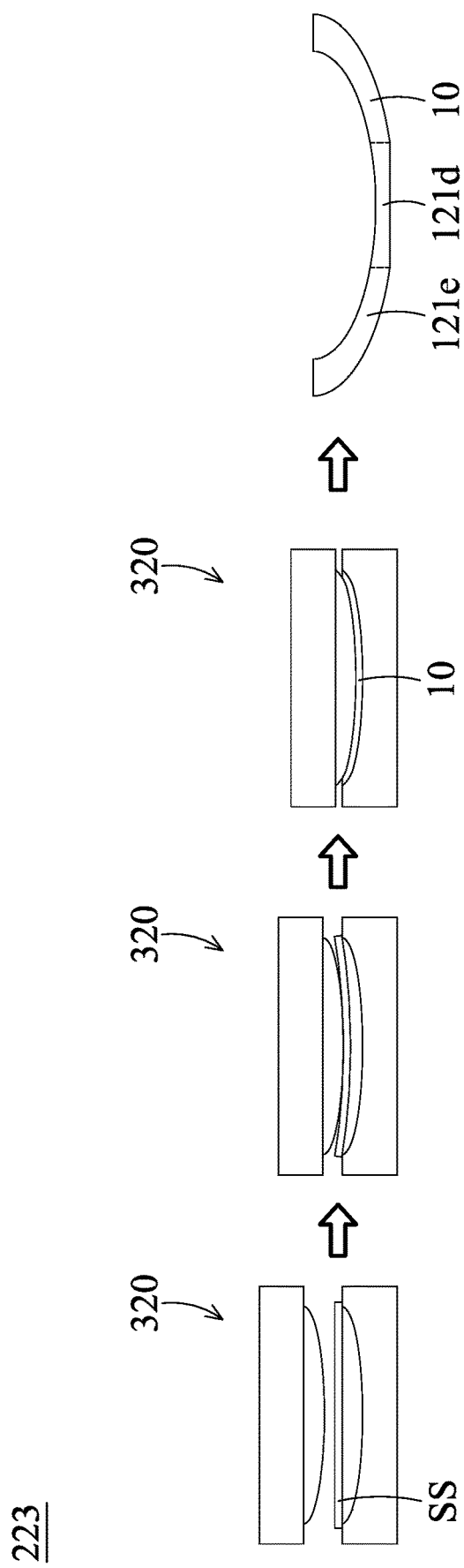
FIG. 10 shows a schematic view of manufacturing a protective substrate using another mold according to some embodiments of the present disclosure.

Please refer to FIG. 10, FIG. 10 shows a schematic view of manufacturing a protective substrate using another mold 320 according to some embodiments of the present disclosure. It should be noted that FIG. 10 only illustrates a part of the mold 320 and a method for manufacturing the protective substrate 10 in a partial region (such as the concave portion 121 of the aforementioned second region 12). As shown in FIG. 10, in step 223, for example, male and female molds 320 have approximately the same radii of curvature are used, and the substrate SS disposed between the male and female molds 310, for example, is heat-pressed and molded to form, for example, a side surface that is corresponding to the concave portion 121 may be ground into a substantially flat surface to form a first portion 121d of the concave portion, and a second portion 121e that is connected to the first portion 121d, but it is not limited thereto. It should be noted that in FIG. 10, the dotted line may be used as the boundary line between the first portion 121d and the second portion 121e.

In other embodiments (not shown), for example, male and female molds 320 with different radii of curvature are used, and the substrate SS between the male and female molds 310, for example, is heat pressed or molded to form a protective substrate 10. The concave portion of the protective substrate 10 has, for example, a first portion 121d and a second portion 121e that is connected to the first portion 121d. The protective substrate 10 formed in step 223 may be similar to the protective substrate 10 described in the embodiment of FIG. 5. Also, according to some embodiments, the first portion 121d and the second portion 121e formed in step 223 may be similar to the first portion 121d and the second portion 121e described in the embodiment of FIG. 5.

Please return to FIG. 7, in step 230, the protective substrate is polished. In step 240, the protective substrate is edged. According to some embodiments, in step 240, the protective substrate may be edged using CNC processing or other means.

According to some embodiments, step 240 may include step 241. In step 241, for example, the concave portion 121 is ground to form a first portion 121d as mentioned above, but it is not limited thereto.

According to some embodiments, in step 241, for example, the protective substrate 10 described in the embodiment of FIG. 3 may be ground to form the protective substrate 10 described in the embodiment of FIG. 5, but it is not limited thereto.

In step 250, chemical strengthening the protective substrate.

In step 260, the protective substrate is assembled with elements in the electronic device to form the electronic device. The elements in the above-mentioned electronic device include, for example, electronic elements 20 or panels, but it is not limited thereto According to some embodiments of the present disclosure, step 260 may include step 261, step 262, and step 263.

In step 261, an attachment is disposed under the concave portion. According to some embodiments, step 261 may include step 261a, step 261b and/or step 261c.

In step 261a, the attachment 30 is disposed under the convex surface 121T of the concave portion 121 (refer to the aforementioned figures). In step 261b, the attachment 30 is disposed between the microstructures 121c (refer to the aforementioned figure), and the attachment 30 is located under the concave portion 121. In step 261c, the attachment 30 is disposed under the first portion 121d of the concave portion 121 (refer to the aforementioned figure).

In step 262, an electronic element 20 (refer to the aforementioned figure) overlaps the concave portion 121 and is disposed under the convex surface 121T. According to some embodiments, the step 262 includes overlapping the electronic element 20 with the convex surface 121T.

According to some embodiments, step 262 includes disposing the electronic element 20 under the attachment 30. In other words, the attachment 30 (refer to the aforementioned figure) is disposed between the concave portion 121 (refer to the aforementioned figure) and the electronic element 20, and the concave portion 121 and the electronic element 20 are fixed by the adhesive 30. According to some embodiments, step 262 includes overlapping the electronic element 20 with the attachment 30.

According to some embodiments, step 262 includes disposing the electronic element 20 under the first portion 121d. According to some embodiments, step 262 includes overlapping the electronic element 20 on the first portion 121d.

In step 263, the protective substrate 10, the electronic element 20, and the attachment 30 are assembled to other elements of the electronic device to form the electronic device.

The electronic device of embodiment of the present disclosure may have improved advantages. For example, the electronic device of the embodiment of the present disclosure may prevent the external moisture from entering the protective substrate 10 and improve the quality of the electronic device. For example, since the protective substrate 10 of the embodiment of the present disclosure is integrally formed, there is no gap between different parts of the protective substrate 10, so foreign matter (such as dust and other particles) will not be disposed between gaps, and the quality of electronic device is improved. In addition, since the electronic device of the embodiment of the present disclosure is made of glass material, the sensitivity may be improved.

Besides, the electronic device of the embodiment of the present disclosure may also have other improved advantages. For example, the electronic device of the embodiment of the present disclosure may prevent the undesired flow of the attachment 30. For example, the electronic device of the embodiment of the present disclosure may increase the attachment area of the attachment 30 and the protective substrate 10, which makes the electronic device more stable.

It should be noted that, as long as the features of the various embodiments of the present application do not violate the spirit of the application or conflict, they may be mixed and matched arbitrarily.

Although the embodiments and the advantages of the present disclosure have been described above, it should be understood that those skilled in the art may make various changes, substitutions, and alterations to the present disclosure without departing from the spirit and scope of the present disclosure. It should be noted that different embodiments may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An electronic device, comprising:
an electronic element; and
a protective substrate, comprising:
a concave portion, having a concave surface and a convex surface that is opposite to the concave surface;
a flat portion, connected to the concave portion; and,
an attachment,
characterized in that:

the electronic element overlaps the concave portion and is arranged under the convex surface;

the attachment is disposed between the electronic element and the convex surface; and the concave portion comprises at least one microstructure, wherein the at least one microstructure is adjacent to the electronic element and is in contact with the attachment.

2. The electronic device as claimed in claim 1, characterized in that:

compared to the concave surface, the convex surface is closer to the electronic element.

3. The electronic device as claimed in claim 1, characterized in that:

the concave portion comprises:

a first portion, overlapping the electronic element; and a second portion, not overlapping the electronic element, wherein the minimum thickness of the first portion is different from the minimum thickness of the second portion.

4. The electronic device as claimed in claim 3, characterized in that:

the minimum thickness of the first portion is less than the minimum thickness of the second portion.

5. The electronic device as claimed in claim 3, characterized in that:

the minimum thickness of the first portion is between 0.5 mm and 1 mm.

6. The electronic device as claimed in claim 3, characterized in that:

the minimum thickness of the first portion is between 0.6 mm and 0.9 mm.

7. The electronic device as claimed in claim 3, characterized in that:

the minimum thickness of the first portion is between 0.65 mm and 0.85 mm.

8. The electronic device as claimed in claim 3, characterized in that:

the minimum thickness of the second portion is between 0.7 mm and 2.0 mm.

9. The electronic device as claimed in claim 3, characterized in that:

the minimum thickness of the second portion is between 0.9 mm and 1.8 mm.

10. The electronic device as claimed in claim 3, characterized in that:

the minimum thickness of the second portion is 1.3 mm.

11. A method of manufacturing an electronic device, comprising:

forming a protective substrate, wherein the protective substrate comprises:

a concave portion having a concave surface and a convex surface that is opposite to the concave surface;

a flat portion, connected to the concave portion; and disposing an attachment between the concave portion and the electronic element, and fixing the concave portion and the electronic element by the attachment, characterized in that:

the method further comprises:

overlapping the electronic element with the concave portion and disposing the electronic element under the convex surface, wherein the protective substrate is formed by thermoforming, and forming a microstructure that is adjacent to the electronic element in the concave portion, wherein the microstructure is in contact with the attachment.

12. The manufacturing method as claimed in claim 11, characterized in that:

the step of forming the protective substrate comprises forming a first portion and a second portion of the concave portion, the step of overlapping the electronic element with the concave portion and disposing the electronic element under the convex surface comprises overlapping the electronic element on the first portion, wherein the minimum thickness of the first portion is different from the minimum thickness of the second portion.

13. The manufacturing method as claimed in claim 11, characterized in that:

the minimum thickness of the first portion is between 0.5 mm and 1 mm.

14. The manufacturing method as claimed in claim 11, characterized in that:

the minimum thickness of the first portion is between 0.65 mm and 0.85 mm.

15. The manufacturing method as claimed in claim 11, characterized in that:

the minimum thickness of the second portion is between 0.7 mm and 2.0 mm.

16. The manufacturing method as claimed in claim 11, characterized in that: the minimum thickness of the second portion is 1.3 mm.

* * * * *